(12) United States Patent
Pan

(10) Patent No.: US 7,403,060 B2
(45) Date of Patent: *Jul. 22, 2008

(54) FORWARD BIASING PROTECTION CIRCUIT

(75) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

This patent is subject to a terminal disclaimer.

(21) Appl. No.: 11/390,852

(22) Filed: Mar. 28, 2006

(65) Prior Publication Data

US 2006/0192606 A1 Aug. 31, 2006

Related U.S. Application Data

(63) Continuation of application No. 10/979,269, filed on Nov. 2, 2004, now Pat. No. 7,098,724.

(51) Int. Cl.
*H03K 5/08* (2006.01)
(52) U.S. Cl. .................................. 327/324; 327/534
(58) Field of Classification Search ................. 327/320, 327/324, 534, 535
See application file for complete search history.

(56) References Cited

U.S. PATENT DOCUMENTS

| | | | |
|---|---|---|---|
| 4,256,977 A | 3/1981 | Hendrickson | 327/434 |
| 4,268,843 A | 5/1981 | Brown et al. | 257/82 |
| 5,689,209 A * | 11/1997 | Williams et al. | 327/425 |
| 5,959,488 A | 9/1999 | Lin et al. | 327/313 |
| 6,404,269 B1 | 6/2002 | Voldman | 327/534 |
| 6,501,632 B1 | 12/2002 | Avery et al. | 361/111 |
| 6,538,279 B1 | 3/2003 | Blanchard | 257/328 |

OTHER PUBLICATIONS

Masayuki Miyazaki, Goichi Ono, and Koichiro Ishibashi, "A 1.2—GIPS/W Microprocessor Using Speed-Adaptive Threshold-Voltage CMOS with Foward Bias," IEEE Journal Solid-State Circuits, vol. 37, No. 2, Feb. 2002, pp. 210-217.

Gabriel A. Rincon-Mora and Phillip E. Allen, "A Low-Voltage, Low Quiescent Current, Low Drop-output Regulator," IEEE Journal Solid-State Circuits, vol. 33, No. 1, Jan. 1998, pp. 36-43.

* cited by examiner

*Primary Examiner*—Kenneth B. Wells
(74) *Attorney, Agent, or Firm*—Fletcher Yoder

(57) ABSTRACT

A forward biasing protection circuit is provided. More specifically, there is provided a device comprising a transistor, a resistive element coupled to the body terminal of the transistor, and a clamping element coupled in parallel to the resistive element and configured to limit a voltage between the source terminal and the body terminal of the transistor. A method of manufacturing the forward biasing protection circuit is also provided.

19 Claims, 3 Drawing Sheets

FORWARD BIASING PROTECTION CIRCUIT

CROSS-REFERENCE TO RELATED APPLICATIONS

This application is a continuation of U.S. application Ser. No. 10/979,269, filed on Nov. 2, 2004, now U.S. Pat. No. 7,098,724.

BACKGROUND OF THE INVENTION

1. Field of the Invention

The present invention relates generally to integrated circuits and, more particularly, to integrated circuits implementing transistors that have been forward biased between the source region and the body to increase the depth of the induced channel.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

As most people are aware, an integrated circuit is a highly miniaturized electronic circuit that is typically designed on a semiconductive substrate. Over the last 10 years, there has been considerable attention paid to designing smaller, lower-power integrated circuits. These smaller, lower-power integrated circuits are often used in portable electronic devices that rely on battery power, such as cellular phones and laptop computers. As circuit designers research new ways to lower the power consumption of integrated circuits, they are constantly confronted with new challenges that need to be overcome in order to create the integrated circuits that will be part of the next generation computer, cellular phone, or camera.

The fundamental building block of the modern integrated circuit is the transistor. Transistors are most often created on a substrate composed of a silicon semiconductor, but they may be created using any one of a number of different semiconductors. Silicon transistors are created by altering the electrical properties of silicon by adding other materials called "dopants" to the silicon. This process is known as doping. In n-type doping, dopants are added to the silicon to provide extra electrons that do not bond with the silicon. These free electrons make n-type silicon an excellent conductor. In p-type doping, silicon is doped with elements that cause an empty space, known as a "hole," to develop in the silicon. Because these holes readily accept electrons from other silicon atoms, p-type silicon is typically also a good conductor.

Even though p-type silicon and n-type silicon are each good conductors, they are not always good conductors when joined. These junctions, called p-n junctions, are essential one way streets for current—allowing it to flow in one direction across the junction but not in the other direction. When current can flow across the p-n junction, it is said to be "forward-biased," and when current can not flow across the p-n junction, it is considered to be "reverse-biased."

A transistor is created by combining two p-n junctions. For example, a transistor might be arranged as either NPN or PNP. In this arrangement, a relatively small current (or voltage, depending on the type of transistor) applied to the center layer will essentially "open up" the transistor and permit a much greater current to flow across the transistor as a whole. In this fashion, transistors can act as switches or as amplifiers.

While there are numerous types of transistors, metal-oxide semiconductor field-effect transistors ("MOSFETs") have been particularly popular over the past few years. One example of this type of MOSFET is known as an n-channel enhancement type MOSFET or NMOS transistor. The NMOS transistor is created by forming two heavily doped n-type regions in a p-type semiconductive substrate (i.e. NPN). These two n-type regions form regions known as the source and drain regions. Next, a thin layer of an oxide insulator may be grown on the surface of the substrate and metal or another conductor may be deposited on this oxide to create a gate region. Terminals are then attached to the source region, the drain region, the gate region, and the p-type semiconductive substrate (also known as "the body") to create a semiconductor device with four terminals: the source ("S") terminal, the drain ("D") terminal, the gate ("G") terminal, and the body ("B") terminal.

A voltage $V_{gs}$ placed between the gate terminal and the source terminal of the NMOS transistor will create an electrical field in the semiconductive substrate below the gate terminal. This electrical field causes mobile electrons in the source region, the drain region, and the substrate to accumulate and form an n-type conductive channel in the p-type substrate. This conductive channel is known as the "induced channel." This n-type induced channel effectively connects the source and drain regions together and allows current to flow from the drain to the source (i.e. opening up the transistor). The voltage $V_{gs}$ that is sufficient to cause enough electrons to accumulate in the channel to form an induced channel (i.e. to open up the channel) is known as the "threshold voltage."

A related type of MOSFET, known as p-channel enhancement type MOSFET or PMOS, is created on an n-type substrate with source and drain regions composed of p-type regions (i.e. PNP). PMOS transistors operate very similarly to NMOS transistors except that the threshold voltage is negative and current flows from the source terminal to the drain terminal.

As stated above, MOSFETs have four terminals: the source, the drain, the gate, and the body. Of these, the body terminal is the least well-known. This is the case because in most early applications, the body terminal was electrically coupled to the source terminal. Connecting the source and body regions together creates a constant reverse bias on the p-n junction between the body and the channel. Because current can not flow across this reverse biased p-n junction, no current could flow into the body, and thus the body typically did not affect the operation of the transistor.

Unfortunately, this same concept does not always apply when there are multiple integrated circuits sharing a single body as with an integrated circuit. Because there are many transistors connected to the same body, it is no longer certain that connecting the source region to the body will create a constant reverse bias. One method of ensuring that the reverse bias is maintained is to connect the body to the most negative power supply in the NMOS MOSFET or the most positive power supply in a PMOS MOSFET. However, this large reverse bias can reduce the depth of the induced channel. Disadvantageously, as the channel becomes shallower, the amount of current that can flow through the induced channel is reduced even though the voltage $V_{gs}$ stays constant. This phenomenon is known as the "body effect." In order to counter the body effect, the voltage $V_{gs}$ may be increased. Years ago when power consumption was not a top priority for circuit designers, increasing $V_{gs}$ did not present a serious problem. In recent years, however, with the rapid growth of mobile technologies that rely on battery power, scientists and engineers have searched for a way to maintain or increase the induced channel current (i.e. deepen the induced channel current) without increasing the voltage $V_{gs}$.

One recent method to increase the channel current without increasing the voltage $V_{gs}$ is to forward bias the p-n junction between the source terminal and the body terminal. In accordance with these techniques, the PMOS body is usually biased lower than the source terminal voltage and the NMOS body is usually biased higher than the source terminal voltage. The forward biasing increases the channel depth, which permits the transistor to conduct more current for a given voltage $V_{gs}$. A channel that can conduct more current can be used to make the transistor operate faster on the same voltage or to reduce the size of the transistor without sacrificing performance.

Unfortunately, forward-biasing the source to body p-n junction can have unintended effects on the circuit. Foremost amongst these effects is the potential for body leakage current. As previously discussed, when a p-n junction is forward biased, it is essentially opened up to the flow of current. This may permit the current flowing across the channel to "leak" into the body of the transistor. Because this leakage current reduces the amount of current that flows between the source and the drain, it can have an adverse effect on the performance of the transistor. This is especially the case if the transistor is driving a particularly small load, and the current across the transistor is relatively small. For larger currents, some leakage current may be permitted to maximize the potential induced channel current, but if this leakage current is not limited in some fashion, its effects can overshadow the potential increase in induced channel current. A circuit that can minimize leakage current for small loads and clamp leakage current for higher loads is desirable.

Embodiments of the present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

Embodiments of the invention provide a method and an apparatus for increasing the potential induced channel current in a transistor without the risk of excess current leakage. Specifically, embodiments of the invention allow near zero current leakage at lower channel currents while at the same time providing a mechanism to limit the induced channel current such that the leakage current does not exceed a predetermined threshold.

In one embodiment, this is accomplished by coupling two resistors, a diode, a current source, and a voltage source to the body terminal of the transistor. Specifically, the two resistors, R1 and R2 are coupled directly to the body terminal with the diode coupled in parallel to the resistors R1 and the resistor R2. The current source is then coupled to the resistor R2 and the voltage source, which is also coupled to the source terminal of the transistor, is coupled to resistor R1. In operation, this configuration clamps the voltage between the source terminal and the body terminal of the transistor to $$Vdiode\left(\frac{R1}{R1+R2}\right)$$

when the current from the current source is high while providing a voltage between the source and body terminals of only R1 multiplied by the current source's current when the current source's current is low.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

Figure 1:
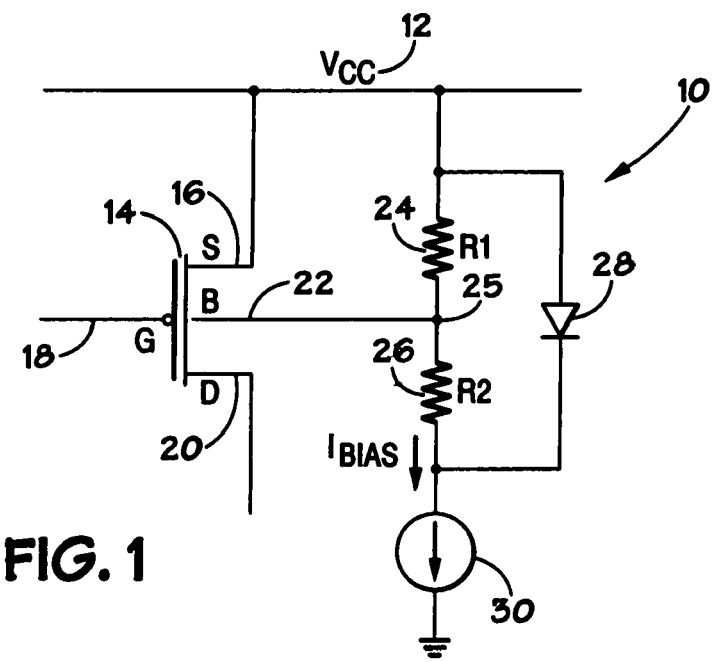
FIG. 1 illustrates a circuit diagram of an exemplary forward biasing protection circuit in accordance with embodiments of the present invention.

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Forward biasing the source to body p-n junction can increase channel depth and thus increase the induced channel current of a transistor. However, if this forward biasing is not carefully controlled, it can result in leakage current that reduces or eliminates the benefits of the forward biasing. For example, where the drain current is relatively small (for example, there is a small load on the transistor), a slight leakage current can greatly reduce the amount of current between the source terminal and the drain terminal. This can have a large effect on the operation of the circuit. Specifically, because the current is small, there may not be enough current to benefit from a deeper channel, and any benefits from the deeper channel may be counteracted by the current lost to leakage current. In this case, keeping the voltage between the source and the body as low as possible is beneficial.

However, as the current at the drain terminal of the transistor increases (i.e. as the load increases), a small amount of leakage current may become an acceptable tradeoff for a deeper channel. In other words, even though some current may be lost to leakage, more overall current may be able to pass between the drain and source than would have otherwise been possible with a shallower channel and no leakage current. For example, properly forward biased, it may be possible to attain an approximately 10% increase in induced channel current with only a 776 nA increase in leakage current. This tradeoff is obviously well worth it. This increase in induced channel current can produce a variety of beneficial results. For example, larger induced channel current can be used to increase the performance of a transistor without increasing the voltage $V_{gs}$. Further, larger induced channel current may allow circuit designers to reduce the size of the transistor without a loss of performance.

Unfortunately, the increase in performance from forward biasing the source to body p-n junction is not continuous, and if the voltage between the source and the body exceeds a certain level (typically around 0.4V), the leakage current can rapidly increase to a detrimental level. For this reason, it can be beneficial to limit the voltage between the source and body to a predetermined maximum level.

Turning now to the drawings and referring initially to FIG. 1, a circuit diagram of an exemplary forward biasing protection circuit in accordance with embodiments of the present invention is illustrated and generally designated by a reference numeral 10. The circuit 10 comprises a voltage source $V_{cc}$ 12. The voltage source 12 may be virtually any type of voltage source and may supply many circuits on a single microchip. The voltage source $V_{cc}$ 12 may be coupled to a metal-oxide semiconductor field-effect transistor ("MOSFET") 14. The MOSFET 14 is a PMOS MOSFET, but those in the art will appreciate that in alternate embodiments, the MOSFET 14 may be a different type of MOSFET. The operation of the MOSFET 14 was briefly described in the background section of this document and is well known to those skilled in the art. The MOSFET 14 typically comprises four terminals: the source terminal 16, the gate terminal 18, the drain terminal 20, and the body terminal 22.

The body terminal 22 may be coupled to a first resistor ("R1") 24 through a first node 25. The resistor R1 24 may also be coupled to the voltage source 12. Both the body terminal 22 and the resistor R1 24 may also be coupled to a second resistor ("R2") 26 through the first node 25. As illustrated in FIG. 1, a diode 28 (a clamping element) may be coupled in parallel to the resistor R1 24 and the resistor R2 26 (a resistive element), and the voltage source $V_{cc}$ 12. The diode 28 will typically be "pointing" toward the junction with the resistor R2 26. In an alternate embodiment of the invention, the resistors R1 and R2 24, 26 may be replaced with transistors that are configured to act as resistors.

The R2 resistor 26 and the diode 28 may also be coupled to a current source 30. The current source 30 may create a current $I_{bias}$ which can be employed to adjust the voltages across various components of the protection circuit 10. The current source 30 may take virtually any form, and the design of the current source 30 is well known to those skilled in the art. In one embodiment, the current source 30 may be comprised of a current mirror that creates an $I_{bias}$ current that is proportional to the current at the drain terminal 20.

Looking now to the operation of the protection circuit 10, it can be seen that when the current $I_{bias}$ is small, the voltage at the node 25, known as the body voltage or $V_{body}$, may be approximately the same as the supply voltage $V_{cc}$ 12. Specifically, the body voltage may be equal to $V_{cc}-I_{bias}*R1$. Because the current $I_{bias}$ is small, the body voltage will be approximately the same as the supply voltage $V_{cc}$ 12. Because of this, the voltage between the source terminal 16 and the body terminal 22 ("$V_{sb}$") may be equal to $I_{bias}*R1$ (the small voltage difference between the $V_{cc}$ and $V_{body}$). As described above, this small $V_{sb}$ can help to limit the leakage current.

Similarly, when $I_{bias}$ is larger, due to the presence of the diode 28, the voltage $V_{body}$ will be clamped to $$Vcc - Vdiode\left(\frac{R1}{R1+R2}\right)$$

and $V_{sb}$ will be limited to $$Vdiode\left(\frac{R1}{R1+R2}\right),$$

where Vdiode is the forward voltage of the diode 28. This feature is advantageous because the value of Vdiode can be selected to ensure that when the current $I_{bias}$ reaches a predetermined threshold, the voltage $V_{sb}$ will be clamped to maintain an acceptable level of leakage current. Unlike when the current $I_{bias}$ is low, the voltage $V_{sb}$ is not sensitive to either the value of the current $I_{bias}$ or the value of R1 because only the ratio of R1 to R1 plus R2 is being applied in the protection circuit 10. It is also important to note that the diode 28 will typically match the process, voltage, and temperature ("PVT") changes of the MOSFET 14. This means that if the PVT characteristics of the MOSFET 14 are altered, the PVT characteristics of the diode 28 will be similarly altered. This can help to keep the leakage current relatively constant at the target level.

Figure 2:
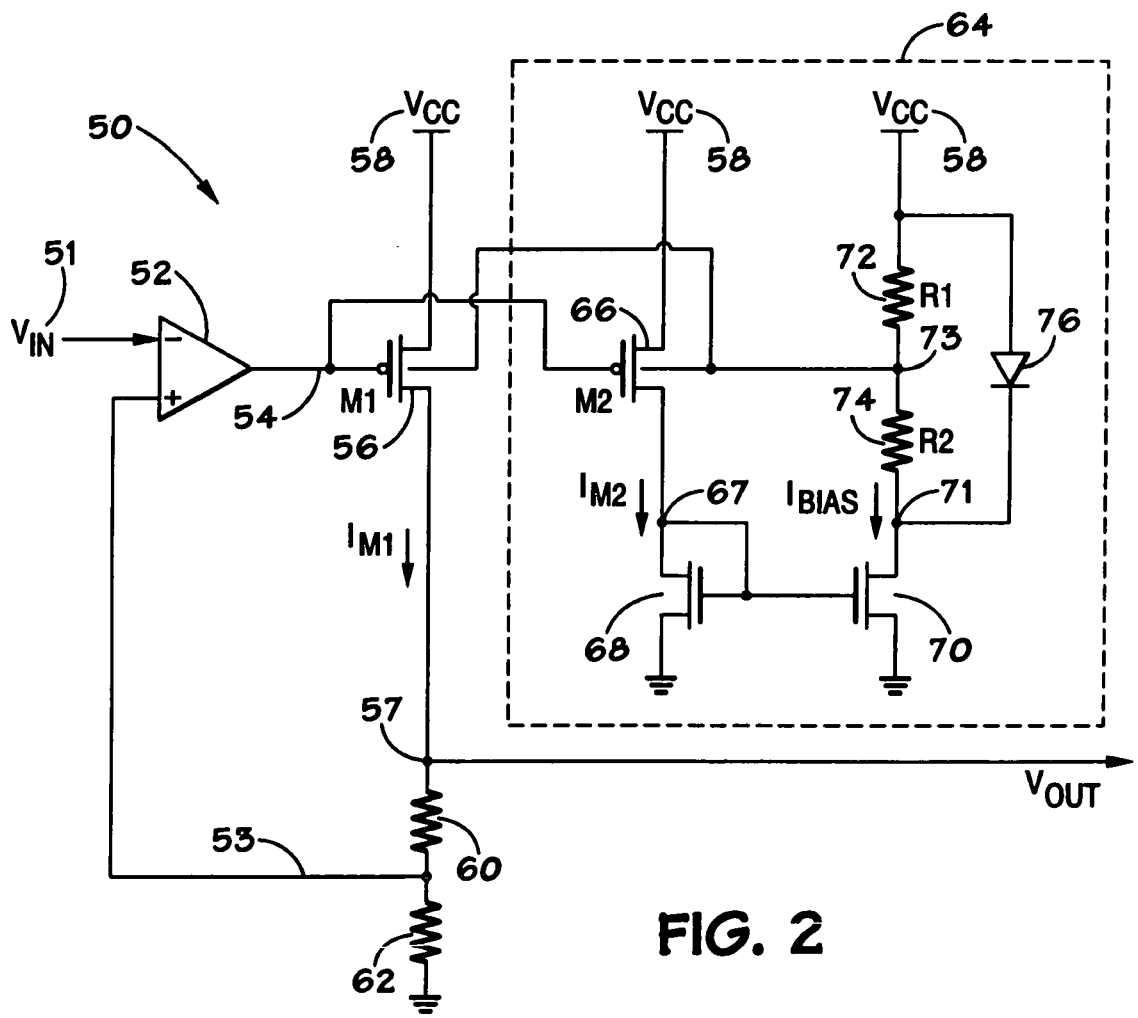
FIG. 2 illustrates a circuit diagram of an exemplary voltage regulator employing a forward biasing protection circuit in accordance with embodiments of the present invention.

Turning next to FIG. 2, a circuit diagram of an exemplary voltage regulator employing a forward biasing protection circuit in accordance with embodiments of the present invention is illustrated and generally referred by a reference numeral 50. The function and operation of a generic voltage regulator is well known in art. Briefly stated, however, voltage regulators are typically used to reduce or eliminate any phase variation present in an incoming signal. This variation typically results from the fact that most power is transmitted over power lines as a sinusoidal waveform, referred to as alternating current, which is converted to a flat waveform, referred to as direct current, in order to be used in many types of devices. Voltage regulators are typically one of the last steps in this conversion process. In integrated circuits, voltage regulators may also be used to convert high voltage direct current from a power supply into lower voltage direct current for use on the integrated circuit. Those skilled in the art, however, will appreciate that voltage regulators can be used for a variety of functions unrelated to converting alternating current to direct current.

The voltage regulator 50 may comprise an operational transductance amplifier ("OTA") 52. The function of the OTA 52 is well known to those skilled in the art and need not be discussed in detail. The OTA 52 has two inputs: an input voltage 51, referred to as $V_{in}$, and a feedback path 53. The OTA 52 is coupled to a MOSFET 56, which is will be referred to as the Transistor M1 56. In one embodiment of the invention, the transistor M1 56 may be a PMOS MOSFET that has four terminals. The source terminal of the transistor M1 56 will typically be coupled to a voltage source $V_{cc}$ 58 whereas the drain terminal of the transistor M1 56 may be coupled to two load resistors 60 and 62.

The body terminal of the transistor M1 56 may be coupled to the body terminal of a MOSFET 66, which will be referred to as the transistor M2 66. The transistor M2 66 may be located within a protection circuit 64. This connection will typically be made by virtue of a common substrate, but in alternate embodiments, a wired connection could be used.

The gate terminal of the transistor M1 56 may be coupled to the OTA 52 as well as to the gate terminal of the transistor M2 66. This connection may create what is known as a "current mirror" between the transistor M1 56 and the transistor M2 66. Current mirrors, which are well known in the art, are employed to produce a current in a second transistor that is proportional to a current in a first transistor. This mirrored current can either be equal to, larger than, or smaller than the original current depending on the relative sizes of the transistors and the configuration of the circuit. However, regardless of whether the mirrored current is larger or smaller than the original current, the mirrored current will generally follow the changes of the original current. For instance, if the original current increases by 10%, the mirrored current will increase by 10%. Because the current on one side of the current mirror can follow the current on the other side of the current mirror, current mirrors, such as the one created by the transistors M1 and M2 56, 66 are typically used to connect components that are intended to be responsive to each other.

Returning now to the current mirror created by the transistor M1 56 and the transistor M2 66, the current at a node 57 located at the transistor M1's drain terminal ($I_{M1}$) will typically be approximately one hundred times greater than the current at a node 67 located at the transistor M2's drain terminal ($I_{M2}$). As will be described in more detail below, this mirroring permits the protection circuit 64 to reduce leakage current by automatically compensating for changes in the current $I_{m1}$. Those skilled in art will appreciate that the particular attributes of the current mirror created by the transistor M1 56 and transistor M2 66 are part of the circuit design process and may be altered without changing the underlying nature of the invention.

The drain terminal of the transistor M2 66 may be coupled to another current mirror created by the MOSFETs 68 and 70. This current mirror is typically employed to permit the protection circuit 64 to be properly grounded and may be altered or absent in other embodiments of the invention. In the embodiment shown in FIG. 2, the current mirror created by the MOSFETs 68 and 70 creates a current $I_{bias}$ at a node 71 that is equal to the current $I_{M2}$. In alternate embodiments, the current $I_{bias}$ may be different than the current $I_{M1}$.

The node 71 at the source terminal of the MOSFET 70 may be coupled to a resistor 74, which will be referred to as the resistor R2 74, and a diode 76. The resistor R2 74 is in turn coupled to the body terminal of the transistor M2 66 and another resistor 72, which will be referred to as the resistor R1 74, at a node 73. The resistor R1 72 may be coupled to the voltage source $V_{cc}$ 58 and to the diode 76.

The protection circuit 64 operates very similarly to the protection circuit 10 depicted in FIG. 1 except that in the protection circuit 64, the current $I_{bias}$ follows the current $I_{M1}$. As discussed above, in the protection circuit 64, the current $I_{bias}$ is equal to the current $I_{M2}$, which tracks the current $I_{M1}$. Thus, when the current $I_{M1}$ increases, the current $I_{bias}$ will increase, and when the current $I_{M1}$ decreases, the current $I_{bias}$ will decrease. Further, as discussed above with reference to FIG. 1, this means that when the current $I_{M1}$ is small, the body voltage at the node 73 will be equal to $V_{cc}-I_{bias}*R1$ and the voltage between the source terminal and the body terminal ($V_{sb}$) of the transistor M2 66 may be equal to $I_{bias}*R1$. As described above, this small voltage $V_{sb}$ may minimize the leakage current. In addition because the body terminal of the transistor M1 56 is coupled to the body terminal of the transistor M2 66 and because the source terminals of both of the transistors should be coupled to the voltage source $V_{cc}$ 58, the voltage between the source terminal and the body terminal of both the transistor M1 56 and the transistor M2 58 may also be equal to $I_{bias}*R1$ when the current $I_{M1}$ is small.

As the current $I_{M1}$ increases, the current $I_{bias}$ will also increase until the voltage between the source terminal and the body terminal of both the M1 and transistor M2s 56, 66 is clamped at $$Vdiode\left(\frac{R1}{R1+R2}\right)$$

by the diode 76 and the R1 and R2 resistors 72 and 74, as described above in relation to the protection circuit 10 shown in FIG. 1. As with the protection circuit 10, this feature is advantageous because Vdiode, the forward voltage of the diode 76, can be selected to ensure that the value of $V_{sb}$ will not result in larger than acceptable leakage current. In one embodiment Vdiode is selected such that $$Vdiode\left(\frac{R1}{R1+R2}\right)$$

will be 0.3V.

Figure 3:
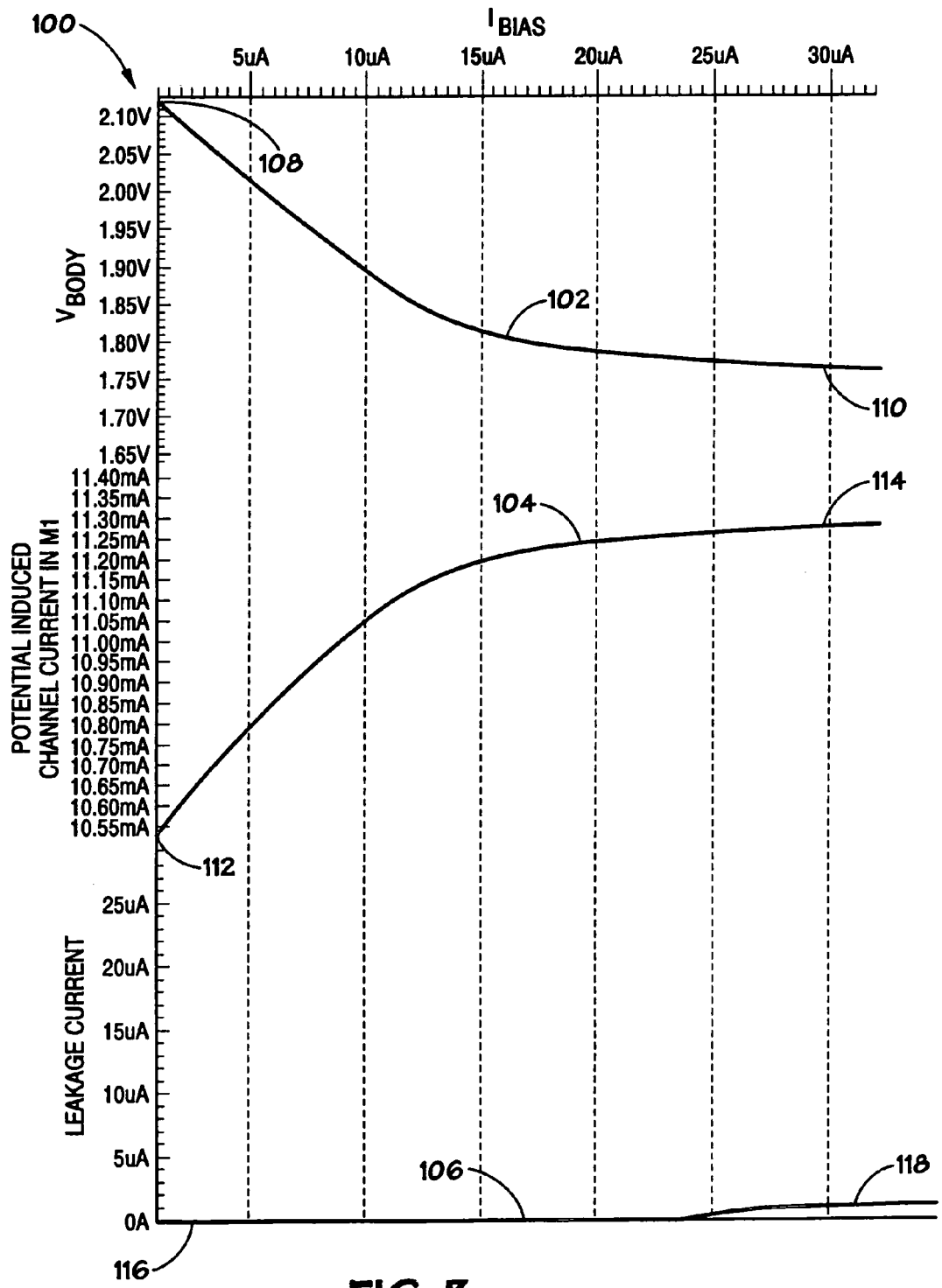
FIG. 3 illustrates a chart depicting simulated performance data for an exemplary voltage regulator employing a forward biasing protection circuit in accordance with embodiments of the present invention.

For example, FIG. 3 illustrates a chart depicting simulated performance data for an exemplary voltage regulator employing a forward biasing protection circuit in accordance with embodiments of the present invention. The chart is generally designated by a reference numeral 100. The chart 100 depicts $V_{body}$ (line 102), the potential induced channel current in M1 (line 104), and leakage current (line 106) as $I_{bias}$ varies between 0 uA and 30 uA. In the simulation shown in chart 100, $V_{cc}$ is set to 2.15V, and the temperature is set to 85 C.

Chart 100 shows that when the voltage regulator is in standby mode (i.e. $I_{m1}$ and $I_{bias}$ are both close to 0 A), the potential induced channel current in M1 (point 112) is at 10.5 mA, the $V_{body}$ (point 108) is at 2.12V (i.e. $V_{sb}$ is close to 0V), and the leakage current (point 116) is close to 0 A. As the $I_{bias}$ increases, the chart 100 shows that $V_{sb}$ increases (because $V_{body}$ decreases) until the diode 76 depicted in FIG. 2 clamps $V_{sb}$ to $$Vdiode\left(\frac{R1}{R1+R2}\right).$$

In the embodiment of the invention depicted in the chart 100, point 110 shows where $V_{sb}$ is clamped to approximately 0.4 volts ($V_{cc}$ of 2.15V minus $V_{body}$ of 1.76V). Further, the chart 100 shows that as $V_{body}$ is clamped, the potential induced channel current in M1 (line 104) levels off at approximately 11.27 mA (point 114) and the leakage current levels off at approximately 776 nA (point 118). Thus, the chart 100 show that the protection circuit 64 depicted in FIG. 2 is able to increase the maximum potential channel current at M1 from 10.5 mA to 11.27 mA while preventing the leakage current from exceeding a predetermined threshold.

It is also important to note that a single forward biasing protection circuit, such as the protection circuit 64 depicted in FIG. 2, can be used in conjunction with multiple voltage regulators in a single computer chip. For example, a computer chip may contain one hundred voltage regulators that could all employ the same forward biasing protection circuit. Because the forward biasing protection circuit may permit a reduction in the size of the transistor M1 within each of these voltage regulators, the forward biasing protection circuit is able to save overall silicon space on the computer chip by reducing the size of each of these regulators.

Figure 4:
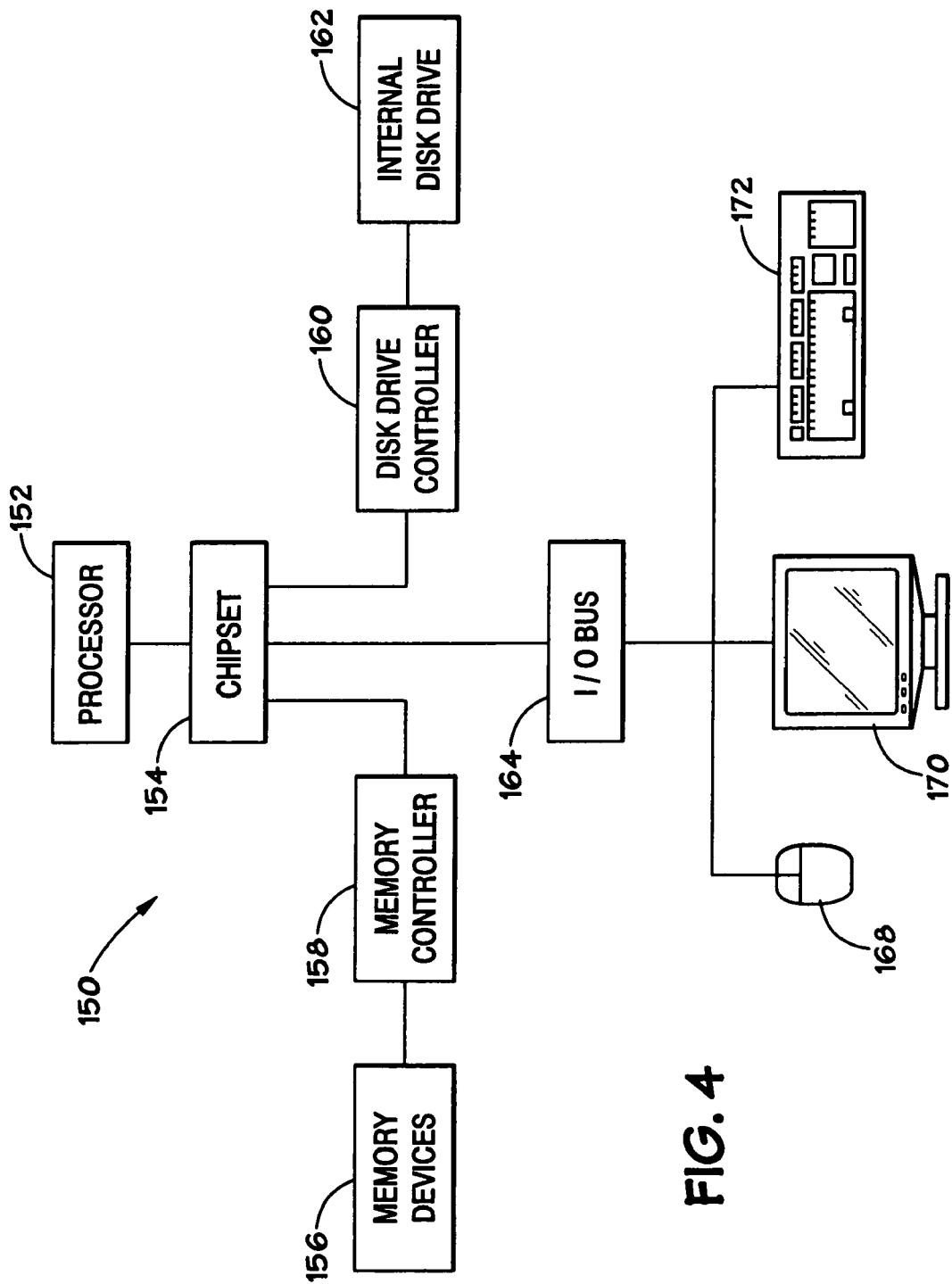
FIG. 4 illustrates a block diagram of an exemplary system employing a forward biasing protection circuit in accordance with embodiments of the present invention.

This configuration is particular useful in the design of memory devices, processors, and computer systems that comprise memory devices. For example, turning back to the drawings and referring to FIG. 4, a block diagram of an exemplary system employing a forward biasing protection circuit in accordance with embodiments of the invention is illustrated and generally designated by a reference numeral 150. The system 150 may include one or more processors or central processing units ("CPUs") 152. The CPU 152 may be used individually or in combination with other CPUs. While the CPU 152 will be referred to primarily in the singular, it will be understood by those skilled in the art that a system with any number of physical or logical CPUs may be implemented. Examples of suitable CPUs include the Intel Pentium 4 processor and the AMD Athlon processor. In one embodiment of the invention, the CPU 152 may comprise the forward biasing protection circuit.

A chipset 14 may be operably coupled to the CPU 152. The chipset 154 is a communication pathway for signals between the CPU 152 and other components of the system 150, which may include, a memory controller 158, an input/output ("I/O") bus 164, and a disk drive controller 160. Depending on the configuration of the system, any one of a number of different signals could be transmitted through the chipset 154, and those skilled in the art will appreciate that the routing of the signals throughout the system 150 can be readily adjusted without changing the underlying nature of the system.

As stated above, the memory controller 158 may be operably coupled to the chipset 154. In alternate embodiments, the memory controller 158 may be integrated into the chipset 154. The memory controller 158 may be operably coupled to one or more memory devices 156. In one embodiment of the invention, the memory devices 156 may comprise the forward biasing protection circuit. The memory devices 156 may be any one of a number of industry standard memory types, including but not limited to, single inline memory modules ("SIMMs") and dual inline memory modules ("DIMMs"). In certain embodiments of the invention, the memory devices 156 may facilitate the safe removal of the external data storage devices by storing both instructions and data.

The chipset 154 may also be coupled to the I/O bus 164. The I/O bus 162 may serve as a communication pathway for signals from the chipset 154 to I/O devices 168-172. The I/O devices 168-172 may include a mouse 168, a video display 170, or a keyboard 172. The I/O bus 164 may employ any one of a number of communications protocols to communicate with the I/O devices 168-172. In alternate embodiments, the I/O bus 164 may be integrated into the chipset 154.

The disk drive controller 160 may also be operably coupled to the chipset 154. The disk drive controller 160 may serve as the communication pathway between the chipset 154 and one or more internal disk drives 162. In certain embodiments of the invention, the internal disk drive 162 may facilitate disconnection of the external data storage devices by storing both instructions and data. The disk drive controller 160 and the internal disk drives 162 may communicate with each other or with the chipset 154 using virtually any type of communication protocol, including all of those mentioned above with regard to the I/O bus 164.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device comprising:
   a transistor comprising a body terminal, a source terminal, and a drain terminal;
   a resistive element coupled to the body terminal; and
   a clamping element coupled in parallel to the resistive element and configured to limit a voltage between the source terminal and the body terminal, wherein the clamping element comprises a diode.

2. The device, as set forth in claim 1, wherein the diode has a forward voltage of Vdiode.

3. The device, as set forth in claim 1, comprising a current source coupled to the resistive element and the clamping element.

4. The device, as set forth in claim 1, comprising a voltage source coupled to the resistive element and to the source terminal.

5. The device, as set forth in claim 1, wherein the transistor comprises a p-channel enhancement metal-oxide semiconductor field-effect transistor.

6. The device, as set forth in claim 1, wherein the transistor comprises an n-channel enhancement metal-oxide semiconductor field-effect transistor.

7. The device, as set forth in claim 1, wherein the device comprises a voltage regulator.

8. The device, as set forth in claim 1, wherein the device comprises a memory device.

9. The device, as set forth in claim 1, wherein the device comprises a processor.

10. A device comprising:
    a transistor comprising a body terminal and a source terminal;
    a first node coupled to the body terminal;
    a first resistor, coupled to the first node and configured to limit the voltage between the source terminal and the body terminal to no greater than the product of a current at the first resistor times the resistance of the first resistor;
    a second resistor being coupled to the first node; and
    a diode, being coupled to the first resistor and the second resistor, wherein the diode is configured to limit the voltage between the source terminal and the body terminal to the product of the voltage across the diode times the ratio of the resistance of the first resistor to the sum of the resistance of the first resistor and the resistance of the second resistor.

11. The device, as set forth in claim 10, comprising a current source configured to generate the current at the first resistor.

12. The device, as set forth in claim 10, comprising a voltage source, wherein the voltage source is coupled to the first resistor and coupled to the source terminal of the transistor.

13. The device, as set forth in claim 10, comprising an operational transductance amplifier, wherein the operational transductance amplifier is coupled to the transistor.

14. The device, as set forth in claim 10, wherein the first resistor comprises a transistor configured to operate as a resistor.

15. A system comprising:
a processor; and
a memory device operatively coupled to the processor, the memory device comprising:
- a circuit comprising a transistor having a source terminal, a drain terminal, and a body terminal; and
- a forward biasing protection circuit coupled to the transistor and comprising:
  - a resistive element coupled to the body terminal; and
  - a clamping element coupled in parallel to the resistive element and configured to limit a voltage across the body terminal of the transistor, wherein the clamping element comprises a diode.

16. The system, as set forth in claim 15, wherein the memory device comprises a synchronous dynamic random access memory (SDRAM) device.

17. The system, as set forth in claim 15, wherein the forward biasing protection circuit comprises a current source, wherein the current source is coupled to the clamping element and wherein the current source generates a current that is proportional to the current between the source terminal and the drain terminal of the transistor.

18. The system, as set forth in claim 15, wherein the circuit is a voltage regulator.

19. The system, as set forth in claim 18, wherein the memory device comprises a second voltage regulator coupled to the forward biasing protection circuit.

* * * * *